(12) United States Patent
Nagumo et al.

(10) Patent No.: US 12,424,496 B2
(45) Date of Patent: Sep. 23, 2025

(54) MANUFACTURING METHOD OF SEMICONDUCTOR DEVICE

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventors: Yuji Nagumo, Nisshin (JP); Masashi Uecha, Nisshin (JP); Hiroki Tsuma, Nisshin (JP); Teruaki Kumazawa, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 472 days.

(21) Appl. No.: 18/065,082

(22) Filed: Dec. 13, 2022

(65) Prior Publication Data

US 2023/0197519 A1 Jun. 22, 2023

(30) Foreign Application Priority Data

Dec. 17, 2021 (JP) .................................. 2021-205290

(51) Int. Cl.
*H01L 21/78* (2006.01)
*H01L 21/04* (2006.01)
*H01L 21/683* (2006.01)

(52) U.S. Cl.
CPC .......... *H01L 21/78* (2013.01); *H01L 21/0475* (2013.01); *H01L 21/0485* (2013.01); *H01L 21/6836* (2013.01); *H01L 2221/68327* (2013.01)

(58) Field of Classification Search
None
See application file for complete search history.

(56) References Cited

U.S. PATENT DOCUMENTS

2020/0361120 A1* 11/2020 Murakami .............. H01L 21/78
2021/0233994 A1* 7/2021 Nakano ................. H10D 30/665
2021/0234007 A1* 7/2021 Ueno ....................... H10D 8/60

FOREIGN PATENT DOCUMENTS

| JP | 2002-134441 A | 5/2002 |
| JP | 2005101120 A | 4/2005 |
| JP | 2007-165371 A | 6/2007 |

* cited by examiner

*Primary Examiner* — Erik T. K. Peterson
(74) *Attorney, Agent, or Firm* — Posz Law Group, PLC

(57) ABSTRACT

In a manufacturing method of a semiconductor device, a semiconductor wafer that is made of a semiconductor material harder than silicon and has a first surface and a second surface opposite to each other is prepared, a roughened layer is formed by grinding the second surface of the semiconductor wafer, a blade is pressed against the roughened layer to form a vertical crack in a surface layer of the semiconductor wafer, the roughened layer is removed after the vertical crack is formed, a rear surface electrode is formed on a rear surface of the semiconductor wafer on which the vertical crack is formed, and after the rear surface electrode is formed, the first surface of the semiconductor wafer is pressed and the semiconductor wafer is cleaved into multiple pieces with the vertical crack as a starting point.

6 Claims, 9 Drawing Sheets

MANUFACTURING METHOD OF SEMICONDUCTOR DEVICE

CROSS REFERENCE TO RELATED APPLICATION

The present application claims the benefit of priority from Japanese Patent Application No. 2021-205290 filed on Dec. 17, 2021. The entire disclosure of the above application is incorporated herein by reference.

TECHNICAL FIELD

The present disclosure relates to a manufacturing method of a semiconductor device.

BACKGROUND

In a conventional manufacturing method of semiconductor devices, multiple element regions having semiconductor elements are formed on a semiconductor wafer, and the semiconductor wafer is cut with a blade so that the element regions are divided into individual pieces. In a dicing process for dividing the semiconductor wafer into individual pieces, a crack may occur in a semiconductor chip or a burr may occur in a rear surface electrode with which the blade comes into contact.

SUMMARY

The present disclosure provides a manufacturing method of a semiconductor device in which a semiconductor wafer that is made of a semiconductor material harder than silicon and has a first surface and a second surface opposite to each other is prepared, a roughened layer is formed by grinding the second surface of the semiconductor wafer, a blade is pressed against the roughened layer to form a vertical crack in a surface layer of the semiconductor wafer, the roughened layer is removed after the vertical crack is formed, a rear surface electrode is formed on a rear surface of the semiconductor wafer on which the vertical crack is formed, and after the rear surface electrode is formed, the first surface of the semiconductor wafer is pressed and the semiconductor wafer is cleaved into multiple pieces with the vertical crack as a starting point.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
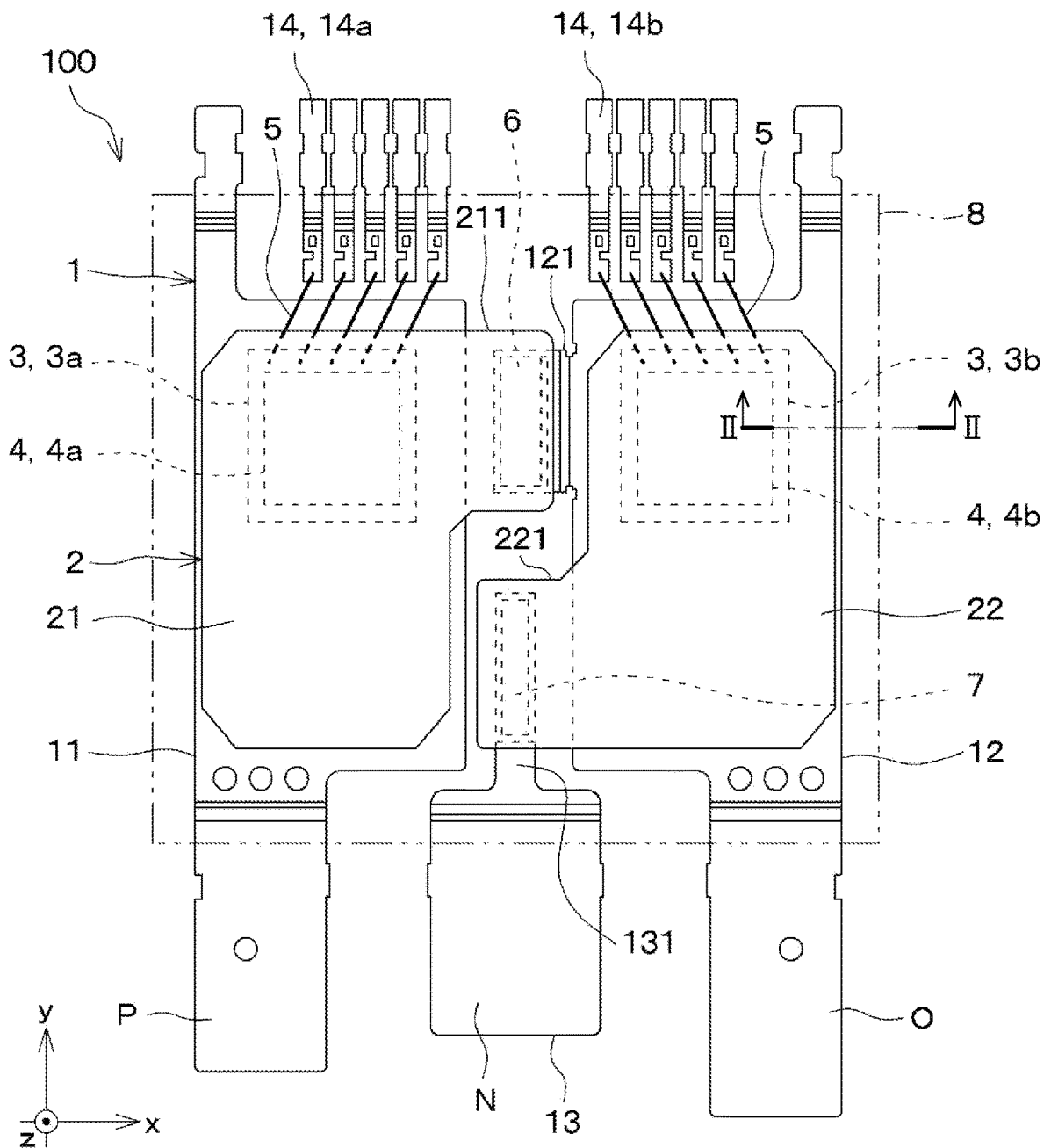
FIG. 1 is a top layout view showing an example of a semiconductor module adopting a semiconductor device according to an embodiment.

In a manufacturing method of a semiconductor device according to a related art, after a V-shaped groove and a rear surface electrode are formed in this order on a rear surface of a semiconductor wafer, a V-shaped groove is formed at a portion of a front surface of the semiconductor wafer located above the V-shaped groove formed on the rear surface. Then, the semiconductor wafer is irradiated with a laser beam to form a modified layer at a portion located inside the semiconductor wafer and between the V-shaped grooves on the front surface and the rear surface. After that, a dicing tape is attached to the semiconductor wafer, and the semiconductor wafer is stretched together with the dicing tape, so that the semiconductor wafer is cleaved and divided with the V-shaped grooves and the modified layer as starting points.

In recent years, in the field of power semiconductor devices such as insulated gate bipolar transistors (IGBTs) and metal oxide semiconductor field effect transistors (MOSFETs), the development of devices using silicon carbide (SiC) as a semiconductor material has progressed. Since SiC has a lower on-resistance and a higher breakdown voltage than silicon (Si), it is expected to improve the performance of power semiconductor devices.

However, since SiC is harder than silicon, when manufacturing a semiconductor device using SiC, a large load is applied to a blade in a dicing process. Therefore, as a method of manufacturing a semiconductor device using a semiconductor material harder than Si, a dicing process including a scribing process and a breaking process may be adopted.

The scribing process is a process of pressing a blade against a semiconductor wafer to form vertical cracks in a surface layer. The breaking process is a process of pressing a plate or the like against a surface of the semiconductor wafer located opposite to a surface on which the vertical cracks are formed, and cleaving and dividing the semiconductor wafer with the vertical cracks as starting points in a manner of three-point bending. Hereinafter, the dicing process including the scribing process and the breaking process performed after the scribing process will be referred to as a "scribing and breaking process" for simplification of explanation.

As a result of diligent studies by the present inventors on methods of manufacturing this type of semiconductor device, it has been found that, in a semiconductor chip divided by the scribing and breaking process, a residual stress in the vicinity of an end surface caused by dicing is larger than a semiconductor chip diced by a cutting process with a blade. The present inventors have further found that if the residual stress is large, a crack will occur due to thermal stress in a semiconductor chip mounted on another member by soldering or the like.

When the manufacturing method according to the related art is applied to this type of semiconductor device, since the surface layer of the hard semiconductor wafer is cut with the blade, a large load is applied to the blade. In addition, since the manufacturing method requires the process of forming the V-shaped groove also on the front surface of the semiconductor wafer with the blade and the process of forming the modified layer by irradiating with the laser beam, the number of processes increases and the manufacturing cost increases. Furthermore, there is concern that residual stress inside the semiconductor wafer may increase due to the process of forming the modified layer by the laser beam irradiation.

In a manufacturing method of a semiconductor device according to an aspect of the present disclosure, a semiconductor wafer that is made of a semiconductor material harder than silicon and has a first surface and a second surface opposite to each other is prepared, the second surface of the semiconductor wafer is ground to form a roughened layer having a surface roughness larger than a surface roughness of the second surface of the semiconductor wafer before grinding, a blade is pressed against the roughened layer to form a vertical crack in a surface layer of the semiconductor wafer, the roughened layer is removed after forming the vertical crack, a rear surface electrode is formed on a rear surface of the semiconductor wafer on which the vertical crack is formed, and after forming the rear surface electrode, the first surface of the semiconductor wafer is pressed, and the semiconductor wafer is cleaved into multiple pieces with the vertical crack as a starting point.

In the manufacturing method of the semiconductor device, the roughened layer is formed by grinding the semiconductor wafer harder than silicon, and the vertical crack is formed in the semiconductor wafer by a scribing process before forming the rear surface electrode. Thus, compared with a case where the vertical crack is formed on a mirror-finished surface, the vertical crack can be formed with a lower pressure and residual stress due to the scribing process can be reduced in the semiconductor device after dicing. In addition, by removing the roughened layer after forming the vertical crack, it is possible to restrict the decrease in bending strength due to the roughened layer, and to obtain the effect of restricting the decrease in reliability.

Hereinafter, embodiments of the present disclosure will be described with reference to the drawings. In the following embodiments, the same or equivalent parts are denoted by the same reference numerals for description.

EMBODIMENTS

A semiconductor module adopting a semiconductor device according to an embodiment will be described with reference to the drawings. This semiconductor device is, for example, a power semiconductor element composed mainly of a semiconductor material harder than silicon, such as SiC, and can be applied to an inverter or the like. In the present disclosure, a case in which the semiconductor device is applied to a semiconductor module that constitutes an inverter will be described as a representative example, but the present disclosure is not limited to this example and can be applied to other uses.

In FIG. 1, in order to facilitate understanding of the configuration of the semiconductor module 100, an outline of a sealing resin 8, which will be described later, is indicated by an alternate long and two short dashes line and portions of constituent elements of the semiconductor module 100 overlapping with other constituent elements other than the sealing resin 8 are indicated by dashed lines.

Hereinafter, for convenience of explanation, as indicated by arrows in FIG. 1, a direction along a right and left direction of a sheet plane of FIG. 1 is referred to as "x direction", a direction perpendicular to the x direction on the sheet plane is referred to as "y direction", and a direction perpendicular to the sheet plane, that is, an xy plane is referred to as "z direction". The x, y, and z directions indicated by arrows and the like in the drawings subsequent to FIG. 1 respectively correspond to the x, y, and z directions in FIG. 1.

[Semiconductor Module]

As shown in FIG. 1, for example, the semiconductor module 100 includes a first lead frame 1, a second lead frame 2, semiconductor devices 3 disposed between the lead frames 1 and 2 in the z-direction, conductor blocks 4, a first connection member 6, a second connection member 7, wires 5, and the sealing resin 8. The semiconductor devices 3 include a first semiconductor device 3a and a second semiconductor device 3b. The conductor blocks 4 include a first conductor block 4a and a second conductor block 4b.

The first lead frame 1 is made of, for example, a conductive material such as copper. The first lead frame 1 includes a positive electrode plate 11 having a positive terminal P, an output plate 12 having an output terminal O, a negative electrode plate 13 having a negative terminal N, and multiple signal terminals 14. The first lead frame 1 has been a plate member in which the positive electrode plate 11, the output plate 12, the negative electrode plate 13, and the signal terminals 14 are connected by connection portions such as bus bars (not shown), and the connecting portions has been removed in a manufacturing process of the semiconductor module 100 so that the positive electrode plate 11, the output plate 12, the negative electrode plate 13, and the signal terminals 14 are separated from each other.

The positive electrode plate 11 has, for example, the positive electrode terminal P that protrudes from the sealing resin 8 along the y direction. The positive electrode plate 11 is disposed apart from the output plate 12 in the x direction, and is mounted with the first semiconductor device 3a via a bonding material (not shown). The positive electrode plate 11 is electrically connected to a first connection plate 21, which will be described later, via the first conductor block 4a disposed on the first semiconductor device 3a. The positive electrode plate 11 has an island portion on which the first semiconductor device 3a is mounted. The island portion has a first surface facing the first semiconductor device 3a and a second surface opposite to the first surface and exposed from the sealing resin 8. Thus, the positive electrode plate 11 can be cooled when the second surface is brought into contact with a cooler (not shown). At this time, an insulating member (not shown) is disposed between the cooler (not shown) and the exposed portion of the island portion to ensure electrical insulation between the cooler and the semiconductor module 100.

The output plate 12 has, for example, the output terminal O disposed in parallel with the positive terminal P and protruding from the sealing resin 8 in the same direction as the positive terminal P. The output plate 12 is mounted with the second semiconductor device 3b. The output plate 12 has, for example, a protruding portion 121 extending toward the positive electrode plate 11 and extending to approach the first connection plate 21 in the z direction, and a first connecting plate disposed on the protruding portion 121. The output plate 12 is electrically connected to the first connection plate 21 via the first connection member 6 disposed on the protruding portion 121. The output plate 12 is electrically connected to a second connection plate 22, which will be described later, via the second conductor block 4b disposed on the second semiconductor device 3b. Similarly to the positive electrode plate 11, the output plate 12 has an island portion on which the second semiconductor device 3b is mounted. The island portion has a first surface facing the second semiconductor device 3b and a second surface opposite to the first surface and exposed from the sealing resin 8. Thus, the output plate 12 can be cooled when the second surface is brought into contact with a cooler (not shown).

The negative electrode plate 13 is disposed between the positive electrode plate 11 and the output plate 12 so as to be apart from the positive electrode plate 11 and the output plate 12. The negative electrode plate 13 has the negative terminal N that is disposed in parallel with the positive terminal P and the output terminal O and protrudes from the sealing resin 8 in the same direction. The negative electrode plate 13 further has an extension portion 131 disposed in a gap between the positive electrode plate 11 and the output plate 12 and extending in a direction opposite to the negative electrode terminal N. The negative electrode plate 13 is electrically connected to the second connection plate 22 via the second connection member 7 disposed on the extension portion 131.

The multiple signal terminals 14 includes multiple first signal terminals 14a connected to the first semiconductor device 3a via the wires 5 and multiple second signal terminals 14b connected to the second semiconductor device 3b via the wires 5. The multiple signal terminals 14 are disposed between the positive electrode plate 11 and the output plate 12 on the side opposite to the terminals P, 0, and N at positions apart from other members.

The second lead frame 2 has, for example, the first connection plate 21 and the second connection plate 22. The second lead frame 2 is disposed to face the first lead frame 1 across the semiconductor devices 3 and the conductor blocks 4 in the z direction. The first connection plate 21 is disposed to face the positive electrode plate 11 and is apart from the second connection plate 22. The first connection plate 21 has, for example, a protruding portion 211 that protrudes toward the second connection plate 22 and is partially bent toward the output plate 12. The first connection plate 21 constitutes a current path connecting the positive electrode plate 11, the first semiconductor device 3a, the first conductor block 4a and the output plate 12 when the first semiconductor device 3a is turned on. The second connection plate 22 has, for example, the same shape as the first connection plate 21 and has a protruding portion 221 that protrudes toward the first connection plate 21. The second connection plate 22 is electrically connected to the negative electrode plate 13 via the protruding portion 221 and the second connection member 7 disposed directly below the protruding portion 221. The second connection plate 22 constitutes a current path connecting the output plate 12, the second semiconductor device 3b, the second conductor block 4b and the negative electrode plate 13 when the second semiconductor device 3b is turned on. Surfaces of the first connection plate 21 and the second connection plate 22 opposite to surfaces facing the conductor blocks 4 are exposed from the sealing resin 8 except for the protruding portions 211 and 221. Thus, the first connection plate 21 and the second connection plate 22 can be cooled by a cooler (not shown) in the same manner as the positive electrode plate 11 and the output plate 12.

The semiconductor device 3 is configured using a semiconductor substrate made of a semiconductor material harder than silicon, such as SiC, gallium nitride (GaN), or gallium oxide ($Ga_2O_3$). Hereinafter, for convenience of explanation, a semiconductor material that is harder than silicon will be referred to as a "hard semiconductor material". The semiconductor device 3 constitutes, for example, a power semiconductor element in which a switching element such as an IGBT or MOSFET and a free wheel diode (FWD) are formed. In the present disclosure, a case where the semiconductor device 3 has an IGBT and an FWD will be described as a representative example, but the present disclosure is not limited to this example. The semiconductor device 3 has, for example, a structure in which an anode and a cathode of the FWD are electrically connected to an emitter, which is a front surface electrode of the switching element, and a collector, which is a rear surface electrode of the surface electrode, respectively. The wires 5 are connected to a gate electrode (not shown) of the switching element of the semiconductor device 3, and the semiconductor device 3 is turned on and off via the signal terminals 14.

Figure 2:
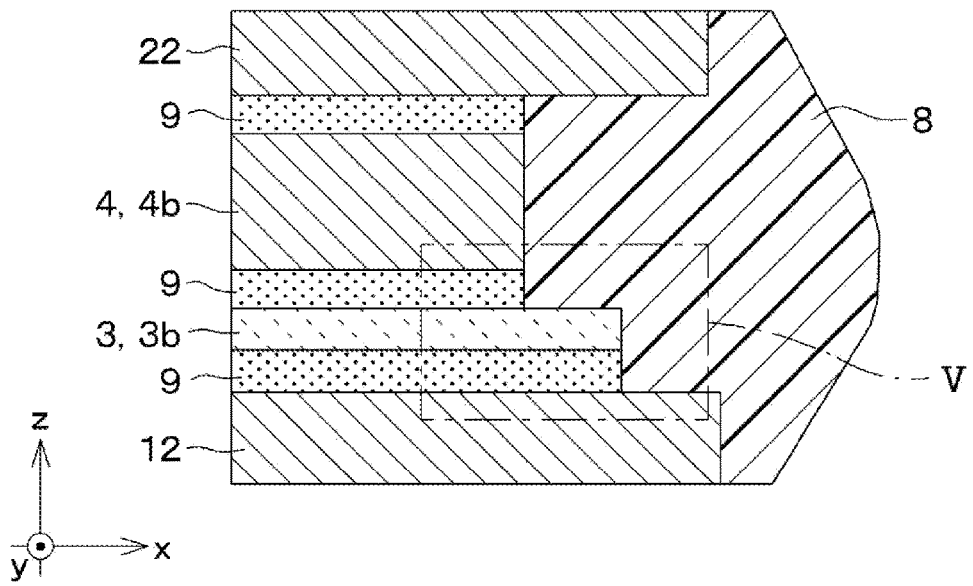
FIG. 2 is a cross-sectional view showing a cross-sectional configuration along line II-II in FIG. 1.

For example, as shown in FIG. 2, the semiconductor devices 3 are mounted on the positive electrode plate 11 and the output plate 12, respectively, via bonding members 9 made of solder or the like. Multiple semiconductor devices 3 are formed on the semiconductor wafer made of the hard semiconductor material with high rigidity, and are diced through a scribing and breaking process, which will be described later. The semiconductor devices 3 are in a state where a residual stress caused by dicing is reduced. The details of reducing the residual stress and its effect will be described later.

The conductor blocks 4 are made of a conductive material such as copper. The conductor blocks 4 are disposed to a side of the semiconductor devices 3 opposite to the positive electrode plate 11 and the output plate 12, and are joined to the semiconductor devices 3 by the bonding members 9. For example, as shown in FIG. 1, the conductor blocks 4 have a plane size smaller than a plane size of the semiconductor devices 3, and are connected to portions of the semiconductor devices 3 other than the portions to which the wires 5 are connected. The conductor blocks 4 are disposed between the positive electrode plate 11 and the first connection plate 21 and between the output plate 12 and the second connection plate 22, respectively, to secure these gaps and to restrict the wires 5 from coming into contact with the connection plates 21 and 22.

The wires 5 are made of a conductive material such as gold or aluminum, and are connected to the signal terminals 14 and the semiconductor devices 3 by wire bonding.

The first connection member 6 and the second connection member 7 are made of a conductive material such as copper. The first connection member 6 and the second connection member 7 are disposed between the protruding portion 121 and the protruding portion 211 and between the extension portion 131 and the protruding portion 221, respectively and electrically connect these portions.

The sealing resin 8 is made of, for example, a thermosetting resin material such as epoxy resin, and is formed by any resin molding method.

The above is the basic configuration of the semiconductor module 100 when configured as an inverter. The semiconductor devices 3 included in the semiconductor module 100 are diced by a scribing and breaking process according to the present embodiment from the semiconductor wafer made of the hard semiconductor material, and the residual stress in the semiconductor device 3 is reduced compared to a semiconductor device diced by a scribing and breaking process according to a comparative example, which will be described later.

[Residual Stress of Semiconductor Device]

As a result of diligent studies by the present inventors, it has been found that when a semiconductor wafer made of a hard semiconductor material such as SiC is diced by the scribing and breaking process according to the comparative example, residual stress in the diced semiconductor chip is large.

Figure 3A:
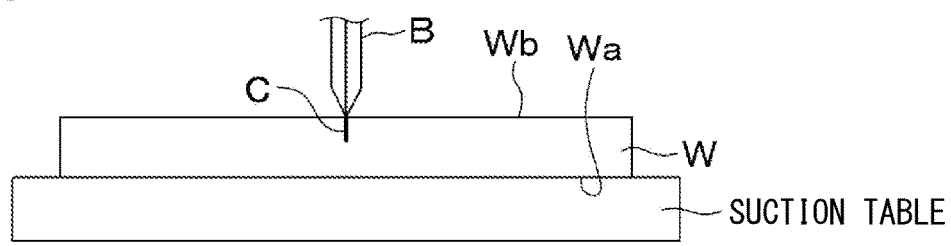
FIG. 3A is an explanatory diagram of a scribing process according to a comparative example.
Figure 3B:
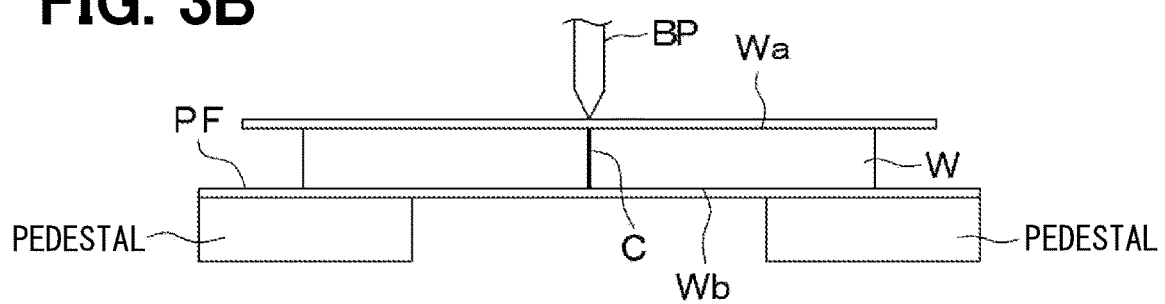
FIG. 3B is an explanatory diagram of a breaking process according to the comparative example.

Here, the scribing and breaking process according to the comparative example will be described with reference to FIGS. 3A and 3B. The scribing and breaking process includes a scribing process for forming a vertical crack C with a predetermined depth in a semiconductor wafer W as shown in FIG. 3A and a breaking process for cleaving the semiconductor wafer in the manner of three-point bending with the vertical crack as a starting point as shown in FIG. 3B. In the scribing process, for example, a front surface Wa of the semiconductor wafer W is temporarily fixed to a suction table or the like, and a blade B is pressed against a rear surface Wb of the semiconductor wafer E to form a vertical crack C in a surface layer of the rear surface Wb. In the breaking process, for example, the semiconductor wafer W is placed on a pedestal in a state where a tape T is attached to the front surface Wa of the semiconductor wafer W, and a protective film PF is attached to the rear surface Wb of the semiconductor wafer W, and a position in the front surface Wa located above the vertical crack C is pressed by a breaking plate BP. At this time, the semiconductor wafer W is in a hollow state in which the portion where the vertical crack C is formed is separated from the pedestal, and both ends sandwiching the portion pressed by the breaking plate BP are supported by the pedestal. Then, the semiconductor wafer W is cleaved and diced in the manner of three-point bending with the vertical crack as the starting point. The scribing process according to the comparative example is performed in a state where the rear surface Wb of the semiconductor wafer W is made into a mirror surface state with very small surface roughness by a polishing process such as chemical mechanical polishing (CMP), and a rear surface electrode made of a metal material is formed on the rear surface Wb.

According to the diligent studies by the present inventors, it has been found that when the semiconductor wafer W is made of a hard semiconductor material, a blade pressure in the scribing process, that is, a scribing pressure increases, and the residual stress in the semiconductor chip after dicing is high.

Figure 4:
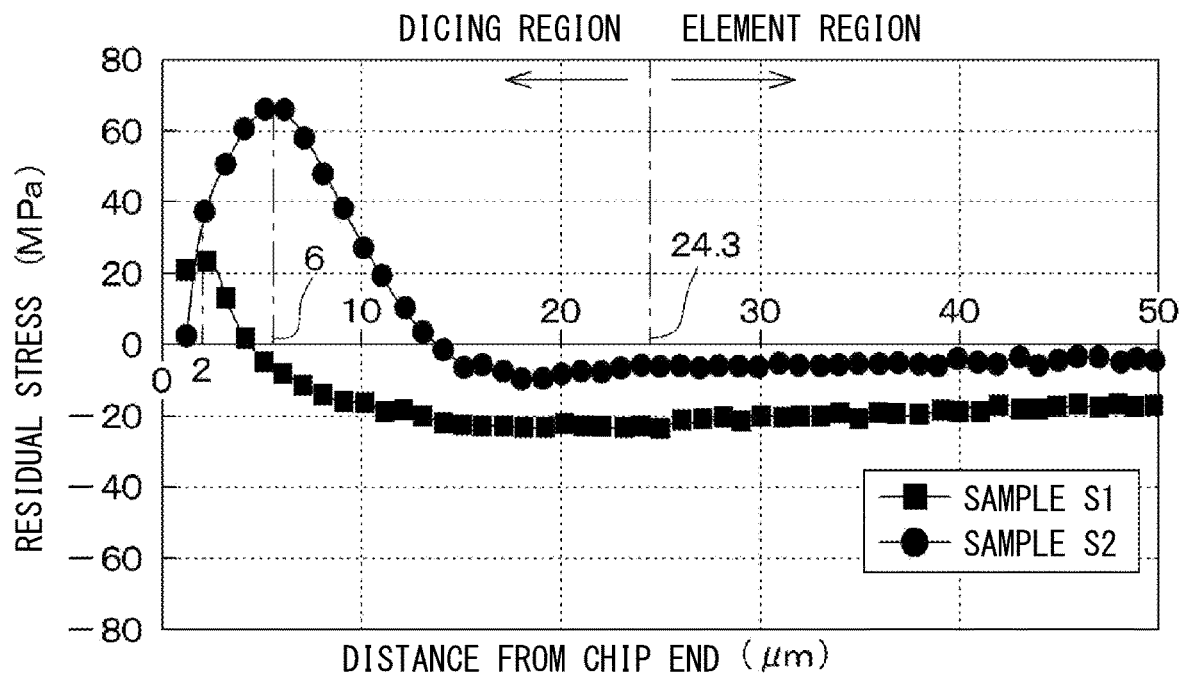
FIG. 4 is a diagram showing measurement results of residual stress of a semiconductor device obtained by a cutting method and a semiconductor device obtained by the scribing and breaking process according to the comparative example.

Specifically, for example, as shown in FIG. 4, a sample S1 of a semiconductor chip obtained by dicing the semiconductor wafer W made of SiC with a blade B had a maximum residual stress of about 23 MPa. Note that sample S1 had the maximum residual stress at a position at a distance of about 2 μm from a chip end surface formed by dicing.

On the other hand, a sample S2 of a semiconductor chip obtained by dicing the semiconductor wafer W made of SiC by the scribing and breaking process according to the comparative example had a maximum residual stress of about 68 MPa. It can be considered that the high residual stress is caused by distortion that remains in the vicinity of a scribe line of the semiconductor wafer W because the vertical crack C is formed in a state where the rear surface Wb of the semiconductor wafer W is mirror-finished and is covered with the rear surface electrode made of the metal material, and a required scribing pressure is as large as about 6 N. Note that sample S2 had the maximum residual stress at a position at a distance of about 6 μm from a chip end surface formed by dicing. The residual stresses of the semiconductor chips shown in FIG. 4 were measured by Raman scattering spectroscopy.

Figure 5:
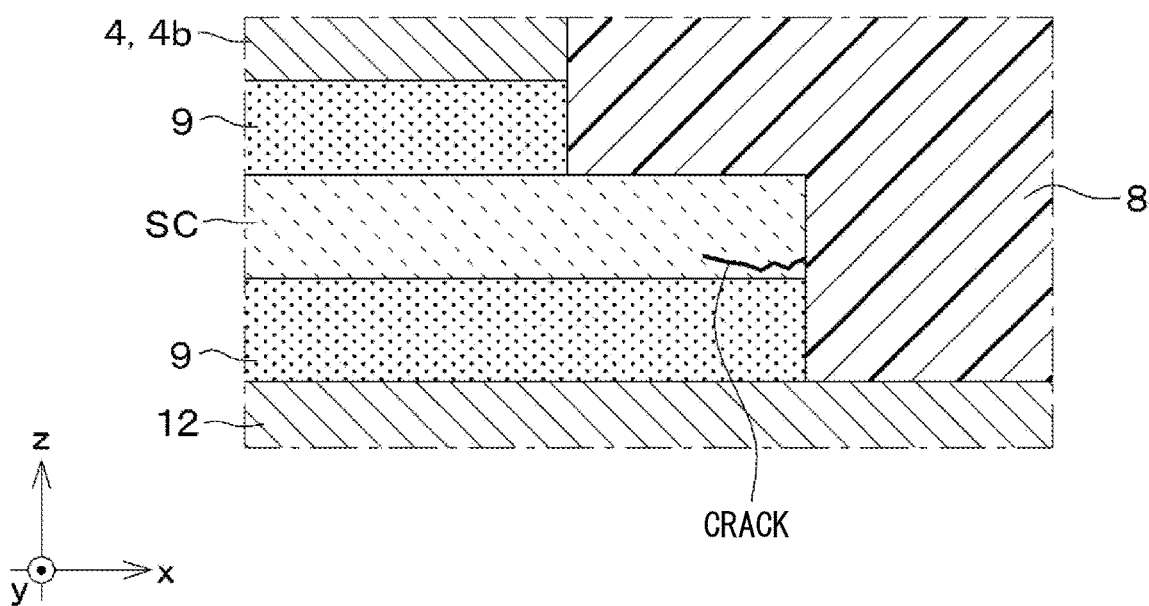
FIG. 5 corresponds to an enlarged view of a region V in FIG. 2, and is an explanatory view of crack generation due to residual stress in the semiconductor device caused by the scribing and breaking process according to the comparative example.

When the semiconductor chip has a high residual stress, the semiconductor chip is subjected to thermal stress due to the difference in thermal expansion coefficient from surrounding members when mounted on another member. When the above-described semiconductor module 100 is configured using a semiconductor chip SC (corresponding to the semiconductor device 3) having a high residual stress, a crack may occur due to thermal stress with a position where the residual stress is high as a starting point, as shown in FIG. 5. When such a crack occurs, the crack progresses toward an element region such as an IGBT, and the reliability of the semiconductor module 100 is lowered.

In order to reduce the residual stress in the semiconductor chip after dicing, it is conceivable to employ a cutting method using a blade. However, when the semiconductor wafer W is made of a hard semiconductor material, since the cutting method using the blade imposes a large load on the blade and increases a time required for dicing as compared with a scribing and breaking process, the manufacturing cost increases. Therefore, the present inventors devised a method of reducing the residual stress in the semiconductor chip after dicing while employing a scribing and breaking process.

[Scribing and Breaking Process]

Next, a scribing and breaking process, which is a dicing process for separating a semiconductor wafer into individual pieces in the manufacturing processes of the semiconductor device 3 according to the present embodiment, and which can reduce the residual stress, will be described. Since a process of forming element regions 31 including switching elements, FWDs, and the like in a semiconductor wafer 30, which will be described later, can be performed by a known semiconductor process, a detailed description thereof will be omitted in the present disclosure.

Figure 6A:
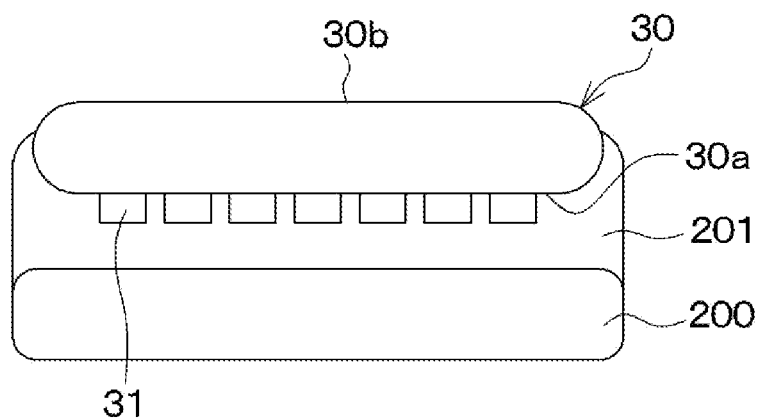
FIG. 6A is a cross-sectional view showing a process of attaching a semiconductor wafer to a support substrate in a dicing process of the semiconductor device according to the embodiment.

First, as shown in FIG. 6A, a first surface 30a of the semiconductor wafer 30 made of a hard semiconductor material such as SiC, on which the element regions 31 are formed, is covered with an adhesive 201 for protection, and then attached to a support substrate 200 so that the semiconductor wafer 30 is temporarily fixed. The support substrate 200 is, for example, a glass substrate having an adhesive film (not shown) made of LTHC manufactured by 3M Company. However, the support substrate 200 may be replaced by a protective tape as long as it can support the semiconductor wafer 30. It is preferable that the support substrate 200 is made of a material such as a glass substrate having higher rigidity than a resin material. This is because the pressing force of the blade applied to the semiconductor wafer 30 is less likely to escape in the subsequent scribing process, and the scribing pressure can be reduced. The adhesive 201 is composed of, for example, any resin material having UV curable and thermoplastic properties.

Figure 6B:
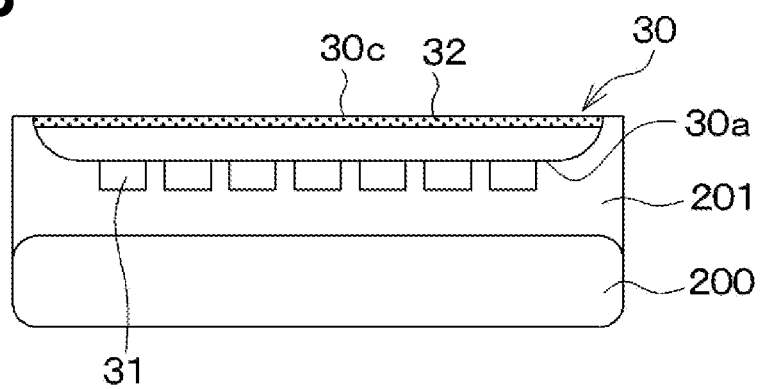
FIG. 6B is a cross-sectional view illustrating a process subsequent to the process illustrated in FIG. 6A.
Figure 7:
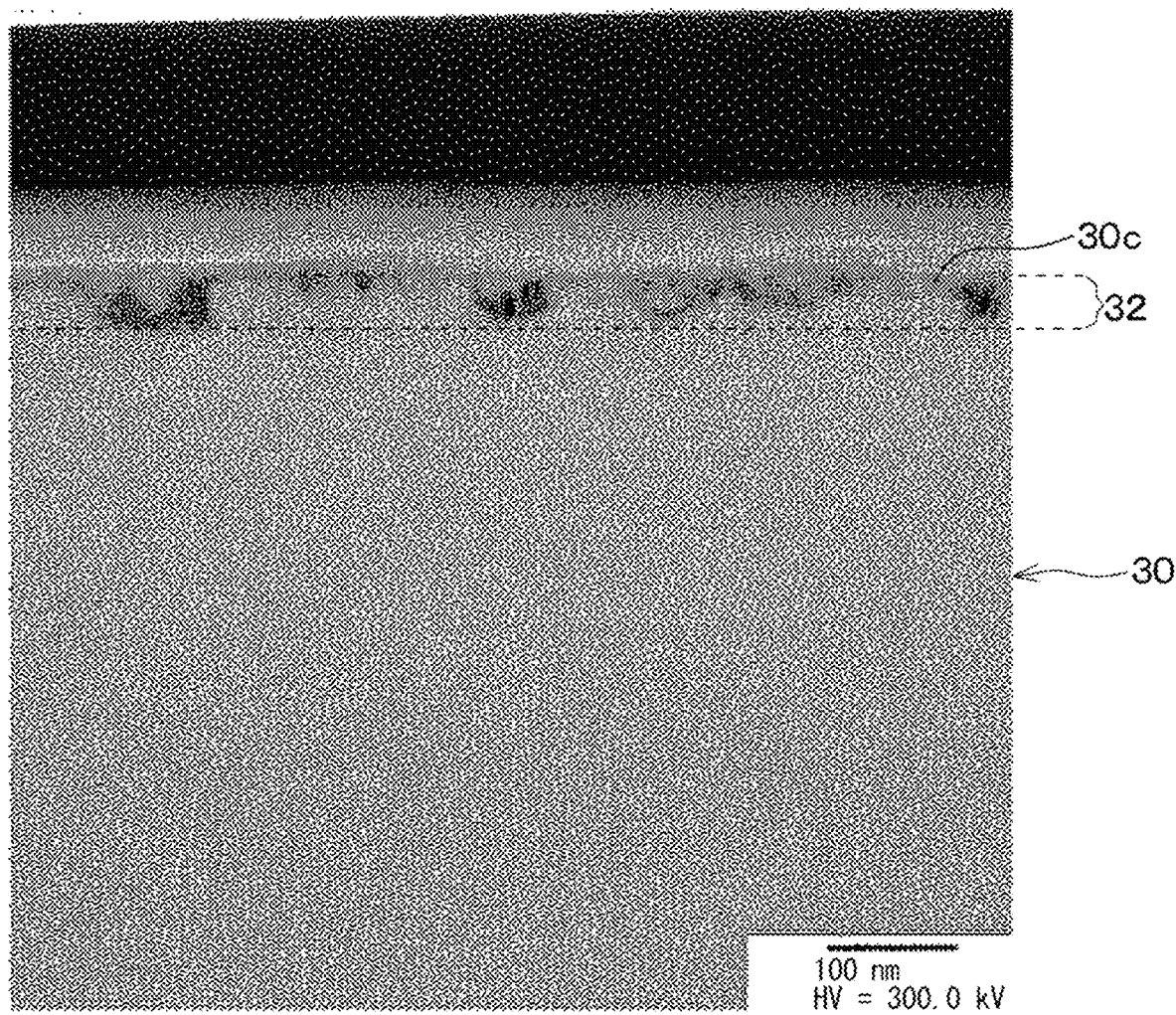
FIG. 7 is a diagram showing a result of observing a cross section of a rear surface side formed in the process shown in FIG. 6B with a transmission electron microscope (TEM)

Next, as shown in FIG. 6B, the semiconductor wafer 30 is thinned by grinding a second surface 30b of the semiconductor wafer 30 located opposite to the first surface attached with the support substrate 200 with a grinding machine (not shown) such as a grinder. In this grinding process, the semiconductor wafer 30 is thinned by roughly grinding with a whetstone, and is different from a polishing process for forming a mirror surface. Thus, a surface layer of a rear surface 30c obtained by grinding the second surface 30b is a roughened layer 32 having a surface roughness larger than a surface roughness of the second surface 30b before grinding. Specifically, as a result of observing a cross section with a transmission electron microscope (TEM), the rear surface 30c of the semiconductor wafer 30 after this grinding process had the roughened layer 32 with uneven surface of about 50 nm in a thickness direction of the wafer from a surface layer, as shown in FIG. 7.

Figure 6C:
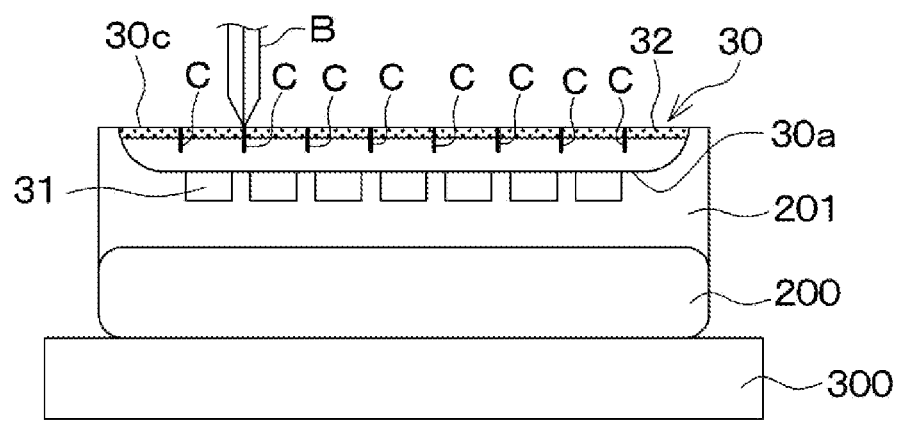
FIG. 6C is a cross-sectional view illustrating a process subsequent to the process illustrated in FIG. 6B.

Subsequently, as shown in FIG. 6C, the semiconductor wafer 30 attached to the support substrate 200 is placed on the pedestal 300, a blade B is pressed against the roughened layer 32, and a vertical crack C is formed in a dicing region between the element regions 31. At this time, for example, the blade B and the dicing region of the semiconductor wafer 30 are aligned with an alignment camera or the like (not shown). The vertical crack C is provided in the surface layer of the rear surface 30c of the semiconductor wafer 30 and extends along the thickness direction of the semiconductor wafer 30.

When a similar scribing process was performed on a mirror-finished SiC wafer before the rear surface electrode is formed thereon, a scribing pressure of about 2 N was required. On the other hand, the semiconductor wafer 30 having the roughened layer 32 requires a scribing pressure of at least less than 2 N in the scribing process because the roughened layer 32 is more fragile than a base made of SiC. As a result, distortion generated in the semiconductor wafer 30 when the vertical crack is formed is reduced, and the residual stress in the vicinity of the scribe line is reduced.

Figure 6D:
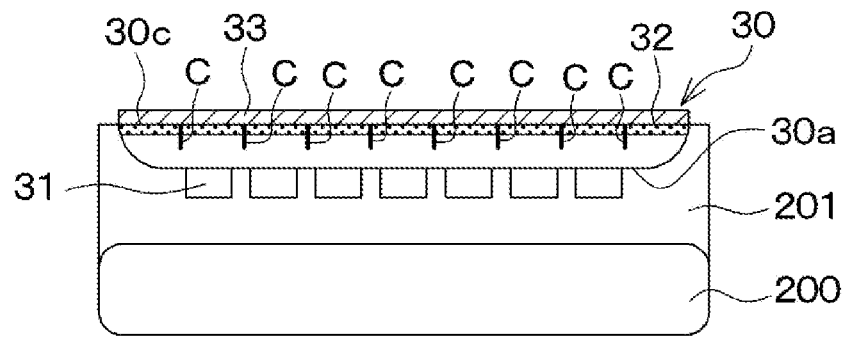
FIG. 6D is a cross-sectional view illustrating a process subsequent to the process illustrated in FIG. 6C.

Then, as shown in FIG. 6D, a rear surface electrode 33 is formed on the rear surface 30c of the semiconductor wafer 30 by sputtering or the like. At least a portion of the rear surface electrode 33 that is in contact with the roughened layer 32 is composed mainly of, for example, at least one conductive metal material selected from the group consisting of Ni (nickel), Ti (titanium), Mo (molybdenum), Ta (tantalum), Pt (platinum), and Co (cobalt), which is capable of silicidizing. In the present disclosure, the term "composed mainly of" means that a content of a main component exceeds 50 vol %. For example, the rear surfaced electrode 33 has a laminated structure of Ni/Ti/Ni/Au (gold) from a side close to the roughened layer 32, and at least a region in contact with the roughened layer 32 is silicidized by the next thermal oxidation process. The rear surface electrode 33 is a thickness larger than a thickness of the roughened layer 32.

For example, when the depth of the roughened layer 32 is 50 nm, the rear surface electrode 33 has a thickness of 100 nm. This is because, in the next process, all of the roughened layer 32 is silicidized together with the rear surface electrode 33, the roughened layer 32 is removed, and an excessive decrease in the bending strength caused by the roughened layer 32 is restricted. When the rear surface electrode 33 formed in the process of FIG. 6D has the laminated structure of Ni/Ti/Ni/Au from the side close to the roughened layer 32, the rear surface electrode 33 has a laminated structure of NiSi/Ti/Ni/Au after the thermal oxidation.

Figure 6E:
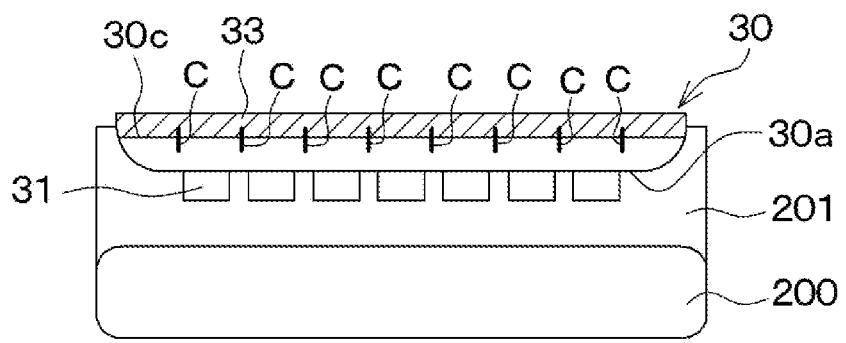
FIG. 6E is a cross-sectional view illustrating a process subsequent to the process illustrated in FIG. 6D.
Figure 8:
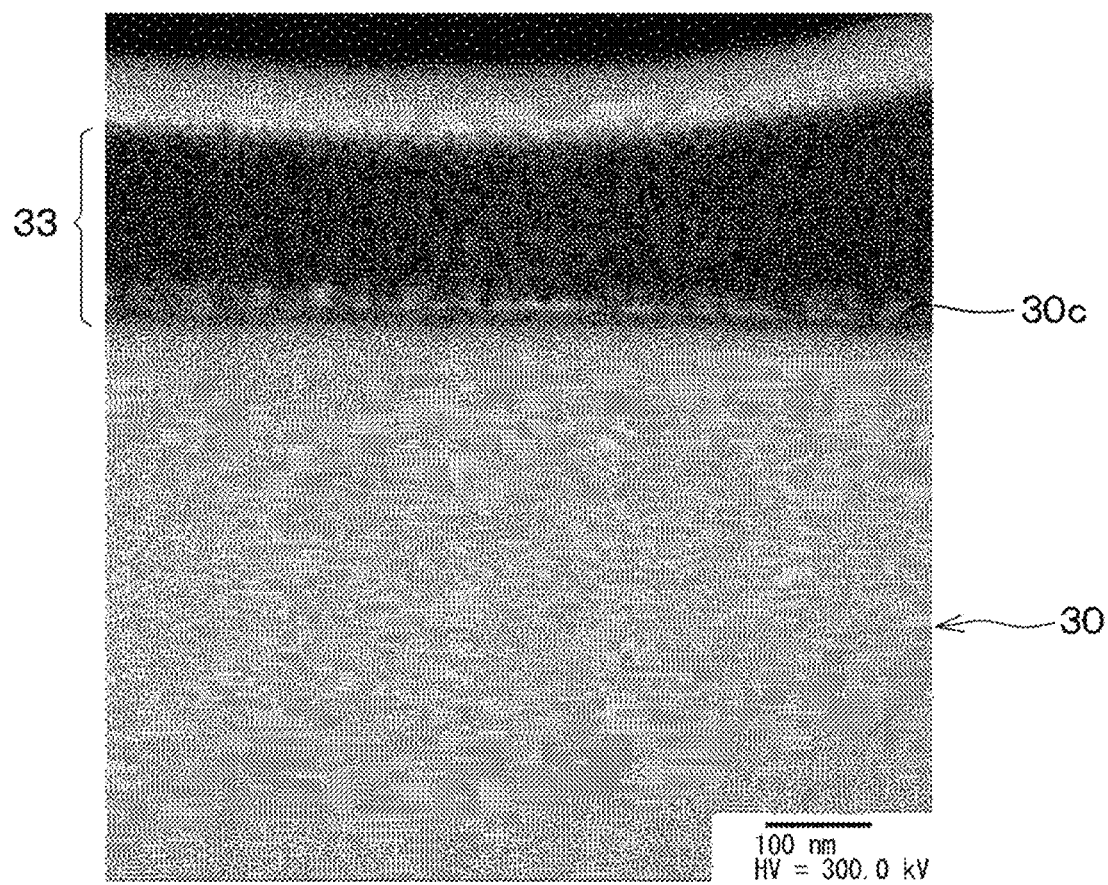
FIG. 8 is a diagram showing a result of observing a cross section of a rear surface electrode after the process shown in FIG. 6E with the TEM.

Thereafter, as shown in FIG. 6E, a heat treatment is performed on the semiconductor wafer 30 to silicidize the roughened layer 32 and the rear surface electrode 33. The heat treatment may be a method of heating the entire semiconductor wafer 30 using a heating furnace or the like, or may be a method of laser annealing in which the rear surface electrode 33 is irradiated with a laser beam to locally heat the rear surface 30c. The heat treatment can be performed by a well-known method. After this heat treatment, the semiconductor wafer 30 had a thickness of about 150 nm due to silicidation of the rear surface electrode 33 and the roughened layer 32, and the roughened layer 32 was removed, as shown in FIG. 8. As a result, an excessive decrease in the bending strength of the semiconductor wafer 30 due to the remaining roughened layer 32 is restricted, an effect of improving reliability is obtained.

Figure 6F:
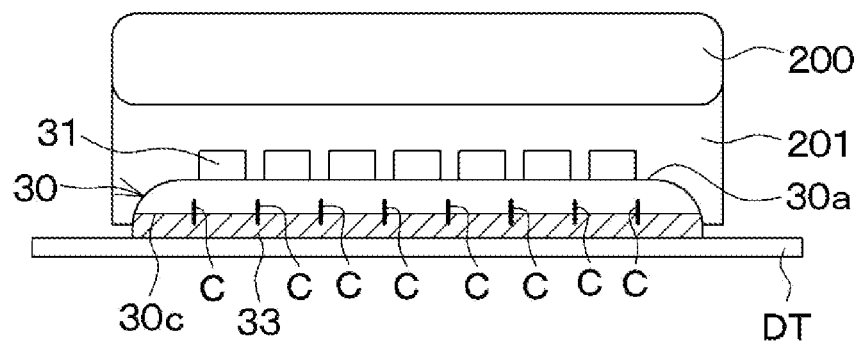
FIG. 6F is a cross-sectional view illustrating a process subsequent to the process illustrated in FIG. 6E.
Figure 6G:
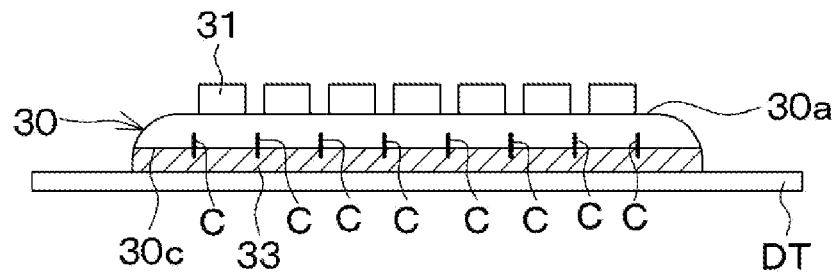
FIG. 6G is a cross-sectional view illustrating a process subsequent to the process illustrated in FIG. 6F.

Next, as shown in FIG. 6F, a dicing tape DT is attached to a surface of the rear surface electrode 33. Then, for example, by irradiating with a laser beam, the semiconductor wafer 30, the adhesive 201, and the support substrate 200 are separated from each other to expose the first surface 30a, as shown in FIG. 6G.

Figure 6H:
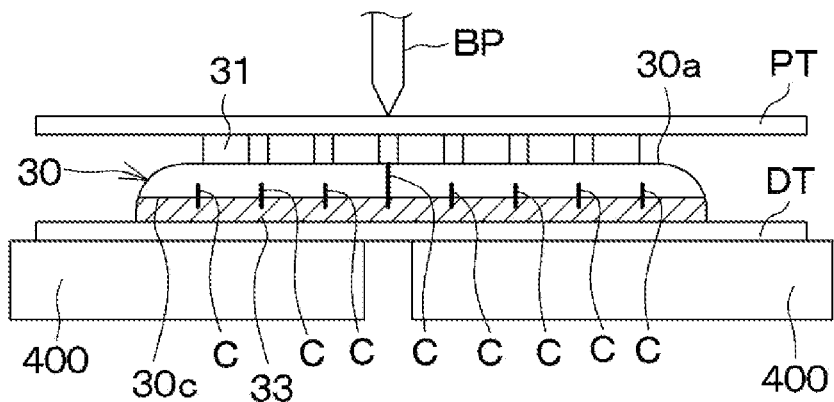
FIG. 6H is a cross-sectional view illustrating a process subsequent to the process illustrated in FIG. 6G.

Subsequently, as shown in FIG. 6H, a protective tape PT is attached to the first surface 30a of the semiconductor wafer 30, and the semiconductor wafer 30 is mounted on a stage 400. At this time, the semiconductor wafer 30 is aligned by an alignment camera or the like (not shown) so that the portion where the vertical crack C is formed is located above a gap provided in the stage 400. Then, a portion of the first surface 30a located above the portion where the vertical crack C is formed is pressed by the break plate BP, and the vertical crack C is propagated in the thickness direction of the semiconductor wafer 30 in the manner of three-point bending to cleave the semiconductor wafer 30. By repeating this breaking process by the number of scribe lines in which the vertical cracks C are formed, the semiconductor wafer 30 is divided into multiple semiconductor devices 3.

Figure 6I:
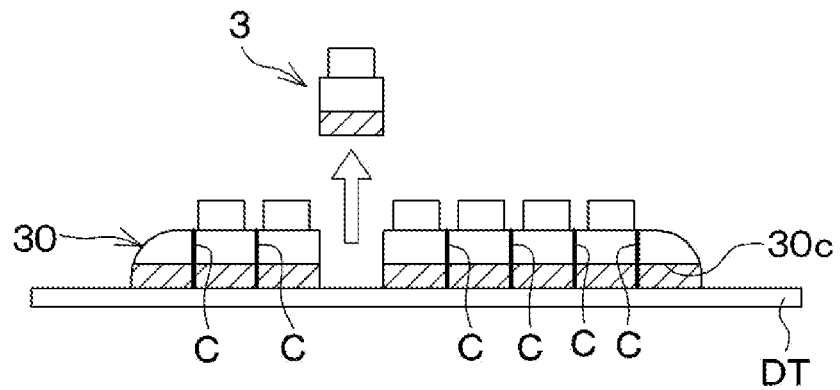
FIG. 6I is a cross-sectional view illustrating a process subsequent to the process illustrated in FIG. 6H.

After the breaking process described above, the protective tape PT is peeled off, and the adhesive strength of the dicing tape DT is reduced by, for example, ultraviolet irradiation or the like. Then, as shown in FIG. 6I, the divided semiconductor devices 3 (semiconductor chips) are picked up by a pick-up apparatus (not shown).

When the semiconductor wafer 30 made of the hard semiconductor material is diced by the scribing and breaking process as described above, the scribing pressure is reduced as compared with the comparative example, and it is possible to obtain the semiconductor device in which the residual stress in the vicinity of an end portion formed by the dicing is reduced. Compared to the cutting method using the blade B, the scribing and breaking process according to the present embodiment can restrict the load applied to the blade B and shorten the time required for dicing. Moreover, formation of a modified layer by a laser beam irradiation is not necessary, and the manufacturing cost of the semiconductor device 3 can be reduced.

Figure 9A:
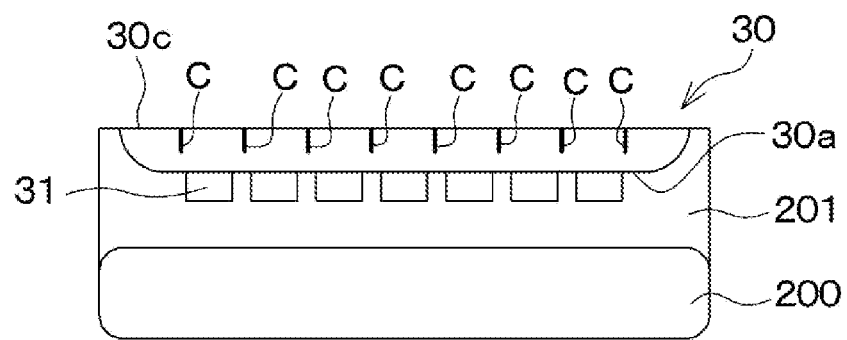
FIG. 9A is a cross-sectional view illustrating another example of a process subsequent to the process illustrated in FIG. 6C.
Figure 9B:
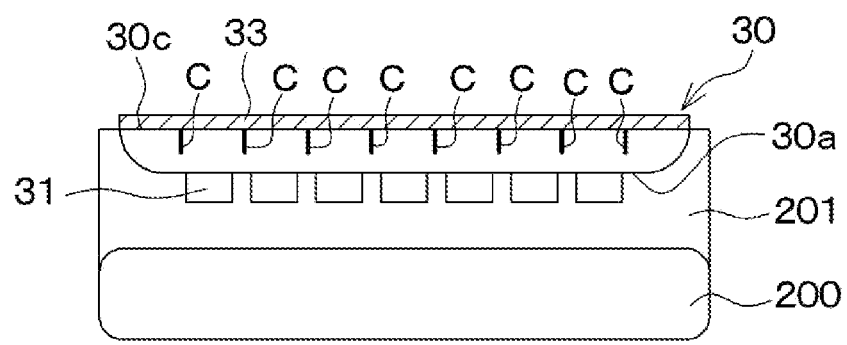
FIG. 9B is a cross-sectional view illustrating a process subsequent to the process illustrated in FIG. 9A.

In the above description, silicidation with the rear surface electrode 33 is taken as an example of the process of removing the roughened layer 32, but the process of removing the roughened layer 32 is not limited to this example. For example, after the scribing process shown in FIG. 6C, the roughened layer 32 may be removed by a mechanical polishing process such as CMP as shown in FIG. 9A. In this case, subsequently, as shown in FIG. 9B, the rear surface electrode 33 is formed on the rear surface 30c of the semiconductor wafer 30 after polishing, and heat treatment is performed. Subsequent processes are the same as above. Even after such processes, since the scribing pressure in the scribing process is reduced and the roughened layer 32 is removed, it is possible to obtain the semiconductor device 3 in a state similar to the semiconductor device 3 manufactured through the dicing process shown in FIG. 6A to FIG. 6I.

OTHER EMBODIMENTS

Although the present disclosure has been made in accordance with the above-described embodiments, it is understood that the present disclosure is not limited to such embodiments and structures. The present disclosure encompasses various modifications and variations within the scope of equivalents. In addition, various combinations and modes, and other combinations and modes including only one element, more elements, or less elements are also within the scope and idea of the present disclosure.

The constituent element(s) of each of the above embodiments is/are not necessarily essential unless it is specifically stated that the constituent element(s) is/are essential in the above embodiment, or unless the constituent element(s) is/are obviously essential in principle. A quantity, a value, an amount, a range, or the like referred to in the description of the embodiments described above is not necessarily limited to such a specific value, amount, range or the like unless it is specifically described as essential or understood as being essential in principle. Further, in each of the above embodiments, when the shape of an element or the positional relationship between elements is mentioned, the present disclosure is not limited to the specific shape or positional relationship unless otherwise particularly specified or unless the present disclosure is limited to the specific shape or positional relationship in principle.

What is claimed is:

1. A manufacturing method of a semiconductor device, comprising:
preparing a semiconductor wafer that is made of a semiconductor material harder than silicon and has a first surface and a second surface opposite to each other;
forming a roughened layer by grinding the second surface of the semiconductor wafer, the roughened layer having a surface roughness larger than a surface roughness of the second surface of the semiconductor wafer before grinding;
pressing a blade against the roughened layer to form a vertical crack in a surface layer of the semiconductor wafer;
removing the roughened layer after forming the vertical crack;
forming a rear surface electrode on a rear surface of the semiconductor wafer on which the vertical crack is formed; and
after forming the rear surface electrode, pressing the first surface of the semiconductor wafer, and cleaving the semiconductor wafer into a plurality of pieces with the vertical crack as a starting point.

2. The manufacturing method according to claim 1, wherein
the forming the roughened layer is performed in a state where the first surface of the semiconductor wafer is attached with a protective tape or a support substrate to protect the first surface.

3. The manufacturing method according to claim 1, wherein
the removing the roughened layer includes removing the roughened layer by polishing.

4. The manufacturing method according to claim 1, wherein
the preparing the semiconductor wafer includes preparing the semiconductor wafer that is made of silicon carbide, and
the removing the roughened layer includes silicidizing the rear surface electrode and the roughened layer after forming the rear surface electrode covering the roughened layer.

5. The manufacturing method according to claim 4, wherein
the forming the rear surface electrode includes forming the rear surface electrode in which a portion being in contact with the roughened layer is composed mainly of at least one metal material selected from a group consisting of Ni, Ti, Mo, Ta, Pt, and Co, and
the removing the roughened layer includes silicidizing the rear surface electrode and the roughened layer by heat treatment.

6. The manufacturing method according to claim 4, wherein
the forming the rear surface electrode includes forming the rear surface electrode having a thickness larger than a thickness of the roughened layer.

* * * * *